United States Patent
Sekiya et al.

(10) Patent No.: US 11,110,549 B2
(45) Date of Patent: Sep. 7, 2021

(54) RECESS OR THROUGH-HOLE FORMING METHOD AND ELECTRODE FORMING METHOD

(71) Applicant: DISCO CORPORATION, Tokyo (JP)

(72) Inventors: Kazuma Sekiya, Tokyo (JP); Naoki Murazawa, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 286 days.

(21) Appl. No.: 16/216,231

(22) Filed: Dec. 11, 2018

(65) Prior Publication Data
US 2019/0193205 A1    Jun. 27, 2019

(30) Foreign Application Priority Data

Dec. 26, 2017  (JP) ............................. JP2017-249776

(51) Int. Cl.
| | |
|---|---|
| *B23K 26/362* | (2014.01) |
| *B23K 26/382* | (2014.01) |
| *B23K 26/08* | (2014.01) |
| *B23K 26/55* | (2014.01) |
| *H05K 3/00* | (2006.01) |

(52) U.S. Cl.
CPC ........ *B23K 26/362* (2013.01); *B23K 26/0853* (2013.01); *B23K 26/0876* (2013.01); *B23K 26/55* (2015.10); *H05K 3/002* (2013.01)

(58) Field of Classification Search
CPC ...... B23K 26/53; B23K 26/55; B23K 26/382; B23K 26/386; B23K 26/402; H05K 3/002
See application file for complete search history.

(56) References Cited

U.S. PATENT DOCUMENTS

| | | | | |
|---|---|---|---|---|
| 2012/0168206 A1* | 7/2012 | Sekine | .................. | H01L 21/486 174/252 |
| 2015/0060402 A1* | 3/2015 | Burkett | .................. | B23K 26/55 216/41 |
| 2016/0059359 A1* | 3/2016 | Krueger | ............. | B23K 26/0006 65/29.1 |
| 2018/0022634 A1* | 1/2018 | Inoue | ................... | B23K 26/382 216/55 |
| 2018/0029924 A1* | 2/2018 | Inoue | ...................... | C03C 15/00 |
| 2018/0037489 A1* | 2/2018 | Ono | ....................... | C03B 33/082 |
| 2018/0340262 A1* | 11/2018 | Hiranuma | ........... | C03C 23/0025 |
| 2020/0009691 A1* | 1/2020 | Ostholt | ............. | B23K 26/0006 |

FOREIGN PATENT DOCUMENTS

| | | | | |
|---|---|---|---|---|
| EP | 2503859 A1 * | 9/2012 | ....... | H01L 23/49827 |
| JP | 2007067082 A | 3/2007 | | |
| JP | 2010077496 | 4/2010 | | |
| WO | 9414187 A1 | 6/1994 | | |

\* cited by examiner

*Primary Examiner* — Geoffrey S Evans
(74) *Attorney, Agent, or Firm* — Greer, Burns & Crain, Ltd.

(57) ABSTRACT

A recess or through-hole forming method for forming a substrate with a recess or a through-hole along a thickness direction of the substrate, the method including: a modified region forming step of applying a laser beam of such a wavelength as to be transmitted through the substrate to the substrate, with a focal region of the laser beam positioned inside the substrate, to form a column-shaped modified region which is exposed to a surface of the substrate and extends along the thickness direction of the substrate; and an etching step of etching the modified region to form the substrate with the recess or the through-hole, after the modified region forming step is performed.

6 Claims, 5 Drawing Sheets

RECESS OR THROUGH-HOLE FORMING METHOD AND ELECTRODE FORMING METHOD

BACKGROUND OF THE INVENTION

Field of the Invention

The present invention relates to a forming method for forming a substrate with a recess or a through-hole and a forming method for forming an electrode in the recess or the through-hole.

Description of the Related Art

In device chips that are mounted on electronic devices, in recent years, a plurality of chips are stacked and accommodated in a single package, for the purposes of reduce the mounting area in mounting the device chips onto a predetermined object, reducing the power consumption in system-on-a-chip (SoC), and the like. In the past, the plurality of chips have been interconnected by wire bonding, and the package should be enlarged as a region for interconnection is needed.

In view of this, there has been developed, for example, a technology in which a silicon substrate is prepared separately from the chips, the silicon substrate is formed with through electrodes along the thickness direction of the silicon substrate, and the silicon substrate is disposed between the plurality of chips to interconnect the chips by the through electrodes. Note that the substrate disposed between the chips is called interposer, and the technology in which upper and lower chips are interconnected by the through electrodes formed in the silicon substrate is called through-silicon via (TSV). The through electrodes are called via electrodes, and the through-holes in which to form the through electrodes are called via holes. The TSV in which a silicon substrate is used as an interposer has a problem in that the silicon substrate is comparatively expensive and transmission loss of electrical signals in the through electrodes is large. To solve this problem, development of through-glass via (TGV) in which a glass substrate is formed with through electrodes to be used as an interposer has been under way. Since a glass substrate is less expensive than a silicon substrate and can be produced in the form of a large-sized substrate, the production cost of an interposer can be suppressed.

Meanwhile, for forming a substrate with through electrodes, first, the substrate is formed with through-holes, and then conductive members are disposed in the through-holes. As a method for forming a silicon substrate with through-holes, there has been known a method in which etching of a silicon substrate and formation of a protective film are repeated (see PCT Patent Publication No. WO94/14187). In this method, the steps of etching predetermined parts of a substrate surface, forming a protective film on inner walls of holes formed by the etching, further etching bottom surfaces of the holes to deepen the holes, and forming a protective film on inner walls of the newly exposed holes are repeated.

In addition, as a method for forming a glass substrate with through-holes, there has been known a method in which a laser beam is applied to a substrate to form minute holes (see Japanese Patent Laid-Open No. 2007-67082). Alternatively, through-holes may be formed at predetermined parts by sandblasting. Further, as a method in which through-holes formed in a substrate are filled with a conductive material to form through electrodes, there has been known, for example, a method in which the conductive material is deposited in the through-holes by electroplating (see Japanese Patent Laid-Open No. 2010-77496). In this method, before carrying out the electroplating, a current-supplying film for functioning as a seed film is formed on inner wall surfaces of the through-holes by sputtering or the like.

SUMMARY OF THE INVENTION

In the method of forming the through-holes by alternately repeating etching and protective film formation, however, the inner walls of the through-holes would be formed in a rugged form, and it may be impossible to uniformly form the seed film on the inner walls of the through-holes by sputtering. Therefore, upon the subsequent electroplating, it may be impossible to form high-quality through electrodes. In addition, in the method of forming the through-holes by applying the laser beam to the substrate, debris, which is a molten product of the substrate that is formed by the application of the laser beam, would deposit on the substrate surface in the surroundings of the through-holes, and it is not easy to remove the debris from the substrate surface. When the interposer with the debris left on the surface is disposed between chips, it may impossible to suitably electrically interconnect the chips by the through electrodes. The present invention has been made in consideration of the above-mentioned problems. It is therefore an object of the present invention to provide a recess or through-hole forming method and an electrode forming method, for forming a substrate with high-quality electrodes.

In accordance with an aspect of the present invention, there is provided a recess or through-hole forming method for forming a substrate with a recess or a through-hole along a thickness direction of the substrate, the recess or through-hole forming method including: a modified region forming step of applying a laser beam of such a wavelength as to be transmitted through the substrate to the substrate, with a focal region of the laser beam positioned inside the substrate, to form a column-shaped modified region which is exposed to a surface of the substrate and extends in the thickness direction of the substrate; and an etching step of etching the modified region to form the recess or the through-hole in the substrate, after the modified region forming step is performed.

Preferably, the substrate is a glass substrate.

In accordance with another aspect of the present invention, there is provided an electrode forming method for forming a substrate with a recess or a through-hole along a thickness direction of the substrate and forming an electrode in the recess or the through-hole, the electrode forming method including: a modified region forming step of applying a laser beam of such a wavelength as to be transmitted through the substrate to the substrate, with a focal region of the laser beam positioned inside the substrate, to form a column-shaped modified region which is exposed to a surface of the substrate and extends in the thickness direction of the substrate; an etching step of etching the modified region to form the substrate with the recess or the through-hole, after the modified region forming step is performed; and an electrode forming step of filling the recess or the through-hole with a conductive member to form the substrate with the electrode along the thickness direction of the substrate, after the etching step is performed.

Preferably, in the electrode forming step, the recess or the through-hole is filled with a conductive powder as the conductive member, and the substrate is heated to form the electrode.

In the recess or through-hole forming method according to the described aspect of the present invention, the laser beam is applied to the inside of the substrate, to form the column-shaped modified region which is exposed to the substrate surface and extends along the thickness direction of the substrate. Instead of partly removing the substrate by a laser beam, the modified region is formed by a laser beam, followed by etching to remove the modified region, thereby forming the recess or through-hole. In this method, debris is not generated, so that deposition of debris on the substrate surface would not occur. When the recess or through-hole formed in the substrate is filled with the conductive member and, for example, a front surface side or a back surface side of the substrate is ground, it is possible to form a through electrode which is exposed to the front surface side and the back surface side. In other words, it is possible to form an interposer which permits suitable interconnection between chips by through electrodes. Therefore, according to the described aspect of the present invention, a recess or through-hole forming method and an electrode forming method, for forming a substrate with high-quality through electrodes, are provided.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Embodiments of the present invention will be described below.

Embodiment 1

Figure 1A:
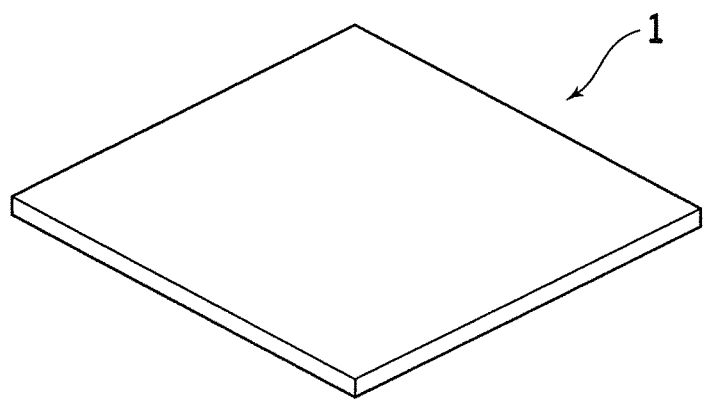
FIG. 1A is a perspective view schematically depicting a substrate.

In the present embodiment, a recess or through-hole forming method including a modified region forming step of applying a laser beam of such a wavelength as to be transmitted through a substrate to a substrate 1, to form minute holes (start point regions) reaching a surface of the substrate and column-shaped modified regions surrounding the minute holes, will be described. FIG. 1A is a perspective view schematically depicting the substrate 1 to be formed with recesses or through-holes by the recess or the through-hole forming method according to the present embodiment. The substrate 1 is a substrate formed from a material such as, for example, sapphire, glass, quartz, silicon, silicon carbide (SiC), lithium tantalate (LT), or lithium niobate (LN). The glass is, for example, borosilicate glass, aluminosilicate glass, soda-lime glass, alkali-free glass or the like.

In the present embodiment, recesses or through-holes are formed along the thickness direction of the substrate 1, a conductive member is disposed in the recesses or the through-holes, and the conductive member is exposed to an upper surface and a lower surface of the substrate 1, to form a plurality of through electrodes penetrating the substrate 1 in the thickness direction of the substrate 1. The substrate 1 formed with the plurality of through electrodes is cut to a predetermined size, to be an interposer. When the interposer is disposed between chips in the case of stacking a plurality of chips to form one package, the through electrodes provide electrical connection between the upper and lower chips. The glass substrate is, for example, easier to enlarge the area than the silicon substrate, and is less expensive than the silicon substrate. When the glass substrate is used as the substrate 1, therefore, the interposer can be produced inexpensively. In addition, when the interposer is produced using the glass substrate, transmission loss of electrical signals in the through electrodes is small as compared to the interposer produced from the silicon substrate.

Figure 1B:
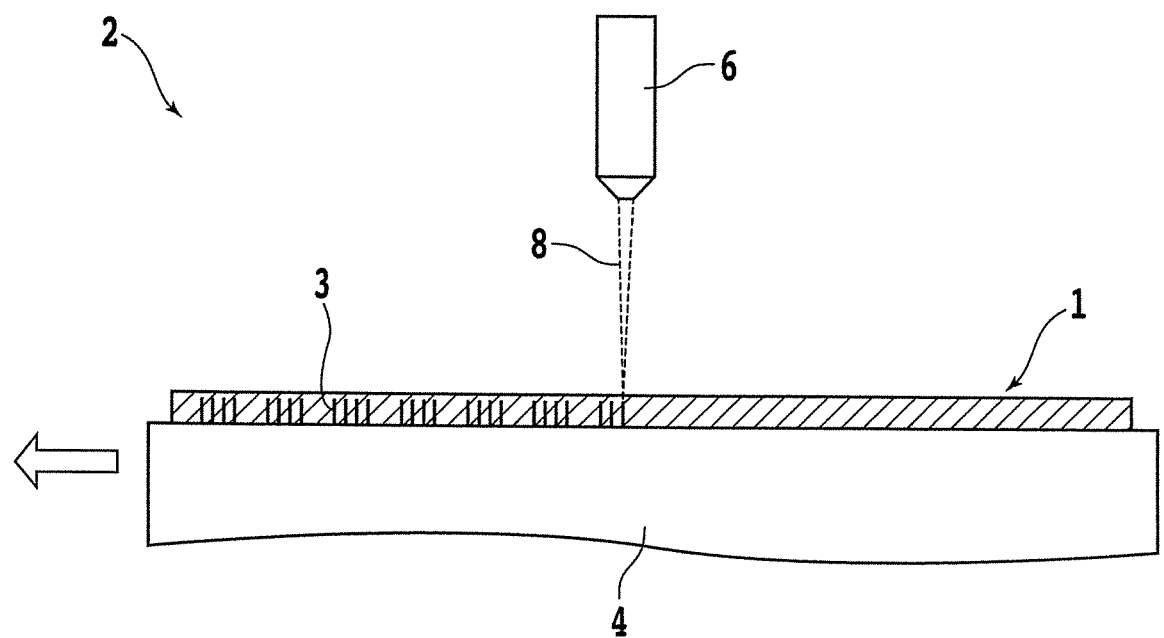
FIG. 1B is a sectional view schematically depicting a modified region forming step.

A laser processing apparatus for use in the recess or through-hole forming method according to the present embodiment will be described below, referring to FIG. 1B. FIG. 1B is a sectional view illustrating a modified region forming step. A laser processing apparatus 2 depicted in FIG. 1B includes a holding table 4 adapted to hold the substrate 1, and a processing head 6. In the laser processing apparatus 2, a laser beam 8 of such a wavelength as to be transmitted through the substrate 1 is oscillated in a pulsed form and is applied to the substrate 1, to form the minute holes (start point regions) reaching from the inside of the substrate 1 to the upper surface or the lower surface of the substrate 1, and column-shaped modified regions surrounding the minute holes.

The holding table 4 includes a suction passage (not depicted) of which one end is connected to a holding surface (upper surface) of the holding table 4, and a suction source connected to the other end of the suction passage. When the substrate 1 is placed on the holding surface and the suction source is operated, the substrate 1 is suction held on the holding table 4. The holding table 4 is movable in a direction parallel to the holding surface. With the holding table 4 moved relative to the processing head 6, a region of the substrate 1 in which to form the recess or through-hole can be positioned at a focal region (described later) of the processing head 6. The processing head 6 is disposed on the upper side of the holding table 4, and has a function of focusing the laser beam 8 of such a wavelength as to be transmitted through the substrate 1 inside the substrate 1.

The processing head 6 focuses the laser beam 8 on, for example, a region extending in the thickness direction of the substrate 1. The region on which the laser beam 8 is focused by the processing head 6 is referred to as the focal region. When the laser beam is applied from the processing head 6 to the substrate 1, the substrate 1 can be formed with a plurality of the minute holes (start point regions) along the thickness direction of the substrate 1, and the column-shaped modified regions surrounding the minute holes.

Here, in the processing head 6, as a lens for focusing the laser beam 8, a focusing lens is used which has such a numerical aperture (NA) that the value obtained by dividing the numerical aperture (NA) by the refractive index of the substrate 1 is in the range of 0.05 to 0.2. In addition, for example, the wavelength of the laser beam 8 applied to the substrate 1 is 1,064 nm, and the average output of the laser beam is 0.2 to 3 W. The repetition frequency of the laser beam 8 and the feeding speed of the substrate 1 are set according to the interval (pitch) of the minute holes and the modified regions to be formed.

The processing head 6 can be moved in the direction perpendicular to the substrate 1, whereby the focal region can be moved in the direction perpendicular to the substrate 1. For example, when the focal region is positioned in such a manner that an upper end of the focal region reaches the upper surface of the substrate 1, application of the laser beam forms the substrate 1 with minute holes opening in the upper surface of the substrate 1 and modified regions surrounding the minute holes and exposed to the upper surface. In addition, when the processing head 6 is positioned such that a lower end of the focal region reaches the lower surface of the substrate 1, the substrate 1 is formed with minute holes opening in the lower surface of the substrate 1 and modified regions surrounding the minute holes and exposed to the lower surface. Further, when the laser beam is focused on a region reaching from the upper surface to the lower surface of the substrate 1, the substrate 1 can be formed, by application of the laser beam, with minute holes opening in both the upper surface and the lower surface of the substrate 1 and modified regions exposed to the upper surface and the lower surface of the substrate 1. Besides, in the laser processing apparatus 2, the oscillated laser beam may be branched into a plurality of laser beams, and the thus branched laser beams may be simultaneously applied to the substrate 1 in such a manner as to be focused on focal positions which are different in distance from the processing head 6.

The recess or through-hole forming method according to the present embodiment will be described below. In the forming method, first, the substrate 1 is placed on the holding table 4 of the laser processing apparatus 2, and the suction source (not depicted) of the holding table 4 is operated, to suction hold the substrate. 1 by the holding table 4. After the substrate 1 is suction held by the holding table 4, a modified region forming step of forming the column-shaped modified regions along the thickness direction of the substrate 1 is carried out. FIG. 1B is a sectional view schematically depicting the modified region forming step.

In the modified region forming step, first, the holding table 4 and the processing head 6 are moved relative to each other in such a manner as to position the processing head 6 over a position of the substrate 1 at which to form the recess or the through-hole. Then, the processing head 6 is moved in the thickness direction of the substrate 1 to position the focal region at a predetermined height position such that the modified region 3 to be formed is to be exposed to at least one of the upper surface and the lower surface of the substrate 1. Next, the laser beam 8 of such a wavelength as to be transmitted through the substrate 1 is applied to the substrate 1, to form the modified region 3 together with a minute hole 8a. After the minute hole 8a and the modified region 3 are formed in one of the regions of the substrate 1 in which to form the recesses or the through-holes, the holding table 4 and the processing head 6 are moved relative to each other, and the laser beam 8 oscillated in a pulsed form is successively applied to the substrate 1, to form the substrate 1 with pluralities of minute holes 8a and modified regions 3. Then, the minute holes 8a and the modified regions 3 are formed in all the regions in which to form the recesses or the through-holes, to complete the modified region forming step.

Figure 2A:
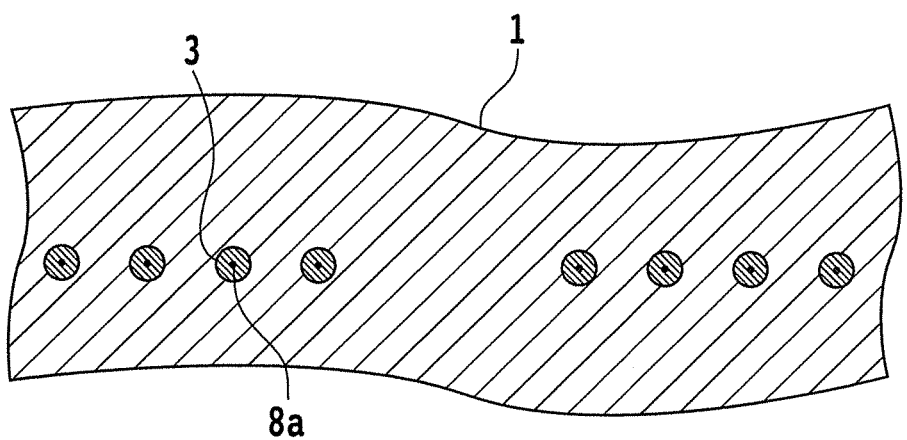
FIG. 2A is a sectional view, taken in parallel to the surface of the substrate, schematically depicting a modified region formed in the substrate.
Figure 2B:
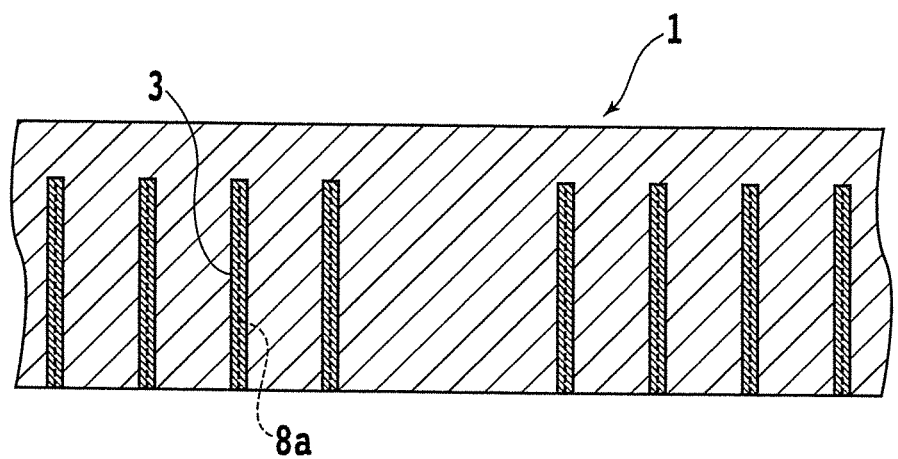
FIG. 2B is a sectional view, in a plane containing the thickness direction of the substrate, schematically depicting the modified region formed in the substrate.

The modified regions 3 formed in the modified region forming step will be described. FIG. 2A schematically depicts the modified regions 3 formed in the substrate 1. FIG. 2A is a sectional view of the substrate 1 in a plane parallel to the surface of the substrate 1. When the laser beam 8 is applied to the substrate 1, the minute holes 8a and the modified regions 3 in the surroundings of the minute holes 8a are formed, as illustrated in FIG. 2A. In addition, FIG. 2B schematically depicts the modified regions 3 formed in the substrate 1. FIG. 2B is a sectional view of the substrate 1 in a plane containing the thickness direction of the substrate 1. When the laser beam 8 is applied to the substrate 1, the minute holes 8a along the focal regions and the modified regions 3 along the thickness direction of the substrate 1 are formed. In the example depicted in FIG. 2B, the substrate 1 is formed with the minute holes 8a opening in the lower surface of the substrate 1 and the modified regions 3 exposed to the lower surface.

Figure 3A:
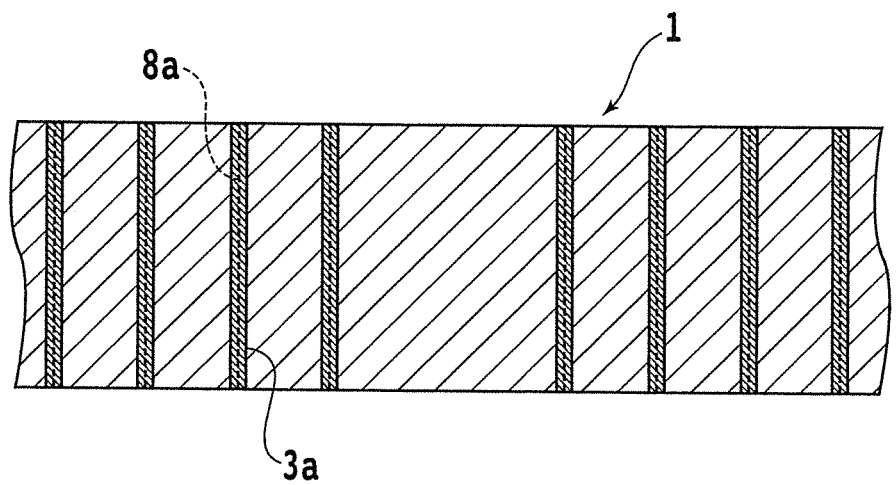
FIG. 3A is a sectional view schematically depicting an example of the modified region formed in the substrate.

Note that the minute holes 8a may not be continuous along the modified regions 3 as depicted in FIG. 2B, and may not be opening in both the upper surface and the lower surface of the substrate 1. In these cases, also, they are referred to as minute holes in the present embodiment. It is to be noted, however, that for suitably forming the recesses or through-holes in an etching step which will be described later, it is preferable for the minute holes 8a to be exposed to at least one of the upper surface and the lower surface of the substrate 1. In addition, the diameter of the minute holes to be formed is not more than 1 μm, and the diameter of the modified regions is approximately several micrometers. FIG. 3A is a sectional view schematically depicting a modification of the modified regions formed in the substrate 1. As depicted in FIG. 3A, in the modified region forming step, the minute holes 8a opening in the upper surface and the lower surface of the substrate 1 and modified regions 3a exposed to the upper surface and the lower surface 3a may be formed in the substrate 1. In this case, for example, the laser beam 8 is applied to regions reaching from the upper surface to the lower surface of the substrate 1.

Figure 4:
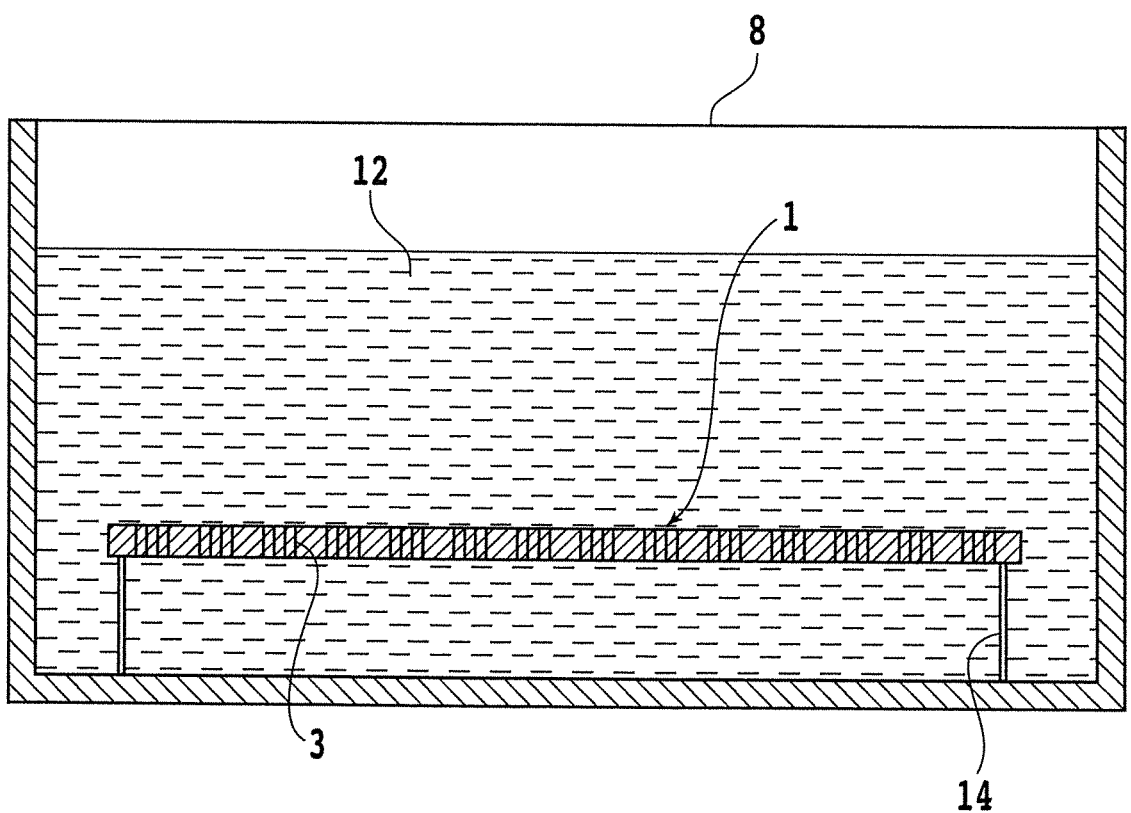
FIG. 4 is a sectional view schematically depicting an etching step.

In the recess or through-hole forming method according to the present embodiment, after the modified region forming step is conducted, the etching step of etching the modified regions 3 to form the substrate 1 with the recesses or the through-holes is carried out. In the etching step, wet etching or dry etching is applied to the substrate 1, to remove the modified regions 3 formed in the substrate 1. A case where wet etching is performed as an example of the etching step will be described using FIG. 4. FIG. 4 is a sectional view schematically depicting the etching step. In a treatment tank 10 for use in the etching step, a liquid etchant 12 is prepared. In the case where the substrate 1 is a glass substrate, an aqueous hydrofluoric acid solution having a concentration of 1.1% (wt/vol %), for example, is used as the etchant 12.

In the etching step, a treatment tank 10 having such a size that the substrate 1 can be immersed in the etchant 12 is used. At a bottom portion of the inside of the treatment tank 10, a support section 14 for exposing part of the lower surface of the substrate 1 into the etchant 12 is disposed. In the etching step, the substrate 1 formed with the modified regions 3 is immersed in the etchant 12 reserved in the treatment tank 10, and is placed on the support section 14.

When the substrate 1 is placed on the support section 14, the upper surface and the lower surface of the substrate 1 are exposed to the etchant 12, and, therefore, etching can proceed from the upper and lower sides. The modified regions 3 are higher in reactivity with the etchant 12 than unmodified regions of the substrate 1. Therefore, the modified regions 3 are etched away. Since the minute holes 8*a* extending along the thickness direction of the substrate 1 are formed in the centers of the modified regions 3, it is easy for the etchant 12 to reach those regions of the modified regions 3 which are deep from the surface of the substrate 1. After the substrate 1 is immersed in the etchant 12 for a predetermined lapse of time, the substrate 1 is drawn up, and is washed with pure water or the like to stop the progress of etching, thereby completing the etching step.

Figure 5A:
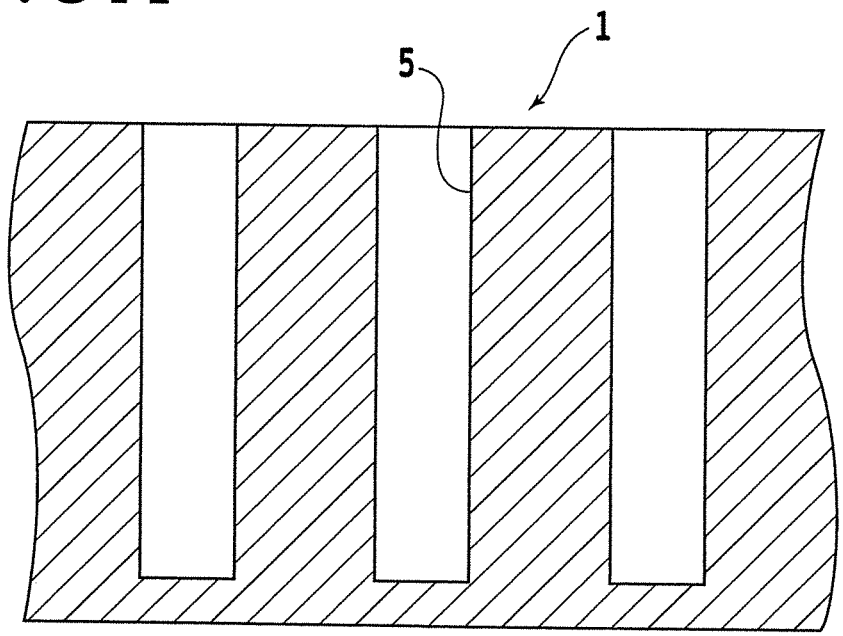
FIG. 5A is a sectional view schematically depicting a recess formed by the etching step.

Note that the treatment tank 10 in which to perform the etching step may not include the support section 14. In that case, for applying etching to both the upper surface and the lower surface of the substrate 1, first, the substrate 1 is immersed in the etchant 12 such that a one-side surface of the substrate 1 makes contact with the bottom surface of the inside of the treatment tank 10, to apply the etching treatment to the other-side surface of the substrate 1. Thereafter, the substrate 1 is inverted upside down, and the etching treatment is applied to the one-side surface of the substrate 1. In the case where the modified regions 3 are exposed to only one of the upper surface and the lower surface of the substrate 1, recesses roughly the same in shape as the modified regions 3 are formed in the substrate 1 by the etching. FIG. 5A is a sectional view schematically depicting recesses 5 formed in the etching step. In addition, in the case where the modified regions 3 are exposed to both the upper surface and the lower surface of the substrate 1, through-holes substantially the same in shape as the modified regions 3 are formed in the substrate 1 by the etching. In other words, when the etching step is performed, the recesses 5 or the through-holes are formed in the substrate 1.

Note that in the forming method according to the present embodiment, the recesses 5 or the through-holes having a diameter of approximately 2 to 10 µm are formed. The diameter of the recesses 5 or the through-holes is determined by the diameter of the modified regions 3 formed in the modified region forming step, the time for which the substrate 1 is exposed to the etchant 12 in the etching step, the properties of the etchant 12, and the like. For example, in the case where the modified regions 3 are exposed to both the upper surface and the lower surface of the substrate 1, when the substrate 1 was immersed in the etchant 12 in such a manner as to make contact with the bottom surface of the treatment tank 10, then the substrate 1 was inverted upside down in the course of etching and the etching was conducted for 10 minutes, through-holes having a diameter of 2.5 µm could be formed. When the etching was performed for 20 minutes in a similar manner, through-holes having a diameter of 4 µm could be formed. When the etching was carried out for 60 minutes, through-holes with a diameter of 6.5 µm could be formed, and when the etching was conducted for 120 minutes, through-holes with a diameter of 10 µm could be formed.

Note that while the etching rate of the substrate 1 in the etchant 12 is lower than that of the modified regions 3, when the etching is continued after the modified regions 3 are completely etched, the etching of the substrate 1 can thereby be made to proceed and the diameter of the recesses or the through-holes can be enlarged. In addition, when the etching is finished before the modified regions 3 are completely etched, the diameter of the recesses or the through-holes to be formed can thereby be reduced. Since the etchant 12 flows through the minute holes 8*a* to reach deep portions of the modified regions 3, the recesses or the through-holes can be suitably formed. In this case, the modified regions 3 may be left in the surroundings of the recesses or the through-holes.

According to the recess or through-hole forming method of the present embodiment, ablation processing by a laser beam is not conducted, and, therefore, adhesion of a molten product (debris) of the substrate 1 to the substrate 1 would not occur. For this reason, when an interposer is produced from the substrate 1, the function of the interposer is not hindered by debris.

Figure 5B:
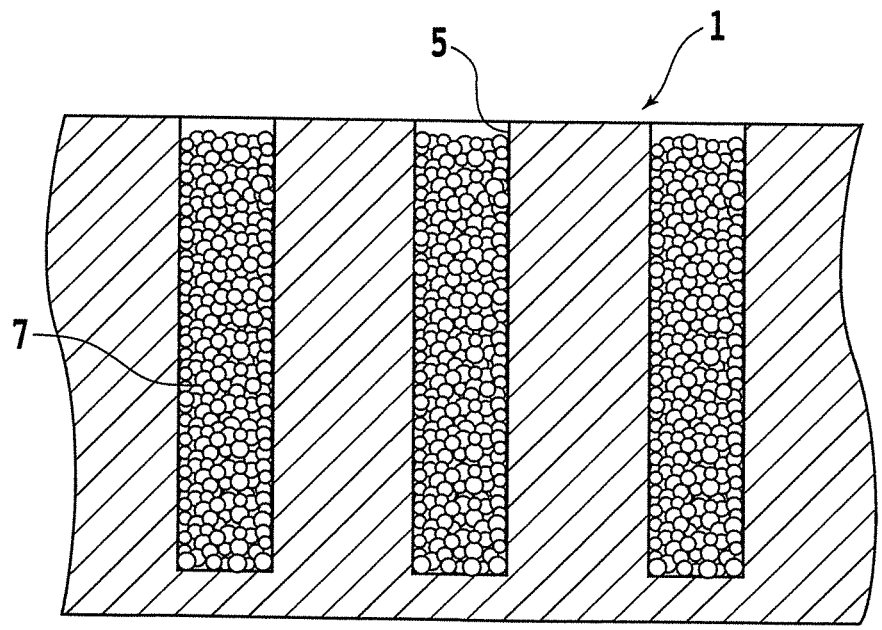
FIG. 5B is a sectional view schematically depicting an electrode formed in the recess.

Next, an electrode forming step is carried out in which the recesses or through-holes formed in the substrate 1 is filled with a conductive material to form the substrate 1 with electrodes along the thickness direction of the substrate 1. For instance, in the case where the recesses 5 are formed in the substrate 1, the recesses 5 are filled with a conductive powder as the conductive material, and the conductive powder is heated. Then, the powder particles are bonded together, to form electrodes 7. FIG. 5B is a sectional view schematically depicting the electrodes 7 formed in the recesses 5. According to this method, the electrodes 7 can be uniformly formed in the inside of the recesses 5.

For the heating of the powder, there is used, for example, an ultrasonic wave generating apparatus which has a focus type horn and can heat a specific region. In addition, in the case where the substrate 1 is high in heat resistance, the substrate 1 may be placed in a furnace or on a hot plate and the substrate 1 may be heated, to thereby heat the conductive powder. Besides, in the case where the through-holes are formed in the substrate 1, for example, the substrate 1 is placed on a mount base having a flat upper surface to close one-side ends of the through-holes, then the through-holes are similarly filled with the conductive powder, and heating is conducted, to form electrodes 7 in the through-holes. In the method of forming the electrodes 7 by filling the recesses 5 or the through-holes with the conductive powder and heating the powder, the recesses 5 or the through-holes can be uniformly filled therein with the powder even in the case where the inner walls of the recesses 5 or the through-holes are rugged, and, therefore, uniform electrodes 7 can be formed in the substrate 1.

The recesses or the through-holes may be filled with the conductive member by other methods. For example, a paste containing a conductive material is supplied into the recesses or through-holes, and the past is solidified. Alternatively, seed films are formed in the inside of the recesses or through-holes by an electroplating method, and the recesses or through-holes are filled with a conductive member by a sputtering method. Note that the conductive member is a conductive material such as, for example, gold, silver, copper, tungsten or aluminum.

After the electrodes 7 are formed in the recesses 5 or the through holes of the substrate 1, the upper surface and the lower surface of the substrate 1 are ground, for causing the electrodes 7 to be through electrodes exposed to both the upper surface and the lower surface of the substrate 1. Particularly, in the case where the recesses 5 are formed in the substrate 1, the substrate 1 is ground in such a manner as to remove bottom portions of the recesses 5, to thereby expose the electrode 7. When the upper surface and the lower surface of the substrate 1 are ground, end portions of the electrodes 7 and the surfaces of the substrate 1 become continuous plain surfaces. When the substrate 1 is then divided into a predetermined size, interposers having a plurality of through electrodes are formed. As has been described above, according to the present embodiment, a recess or through-hole forming method and an electrode forming method, for forming a substrate 1 with high-quality through electrodes, are provided.

Embodiment 2

In the present embodiment, a recess or through-hole forming method including a modified region forming step in which a laser beam of such a wavelength as to be transmitted through a substrate is applied to the substrate, with a focal point of the laser beam positioned inside the substrate to form modified regions by multiphoton absorption, and the laser beam is applied multiple times while varying the height of the focal region, will be described. The forming method according to the present embodiment differs from the forming method according to the above-described embodiment only in the modified region forming step, and, therefore, descriptions of other points than the modified region forming step will be omitted.

Figure 3B:
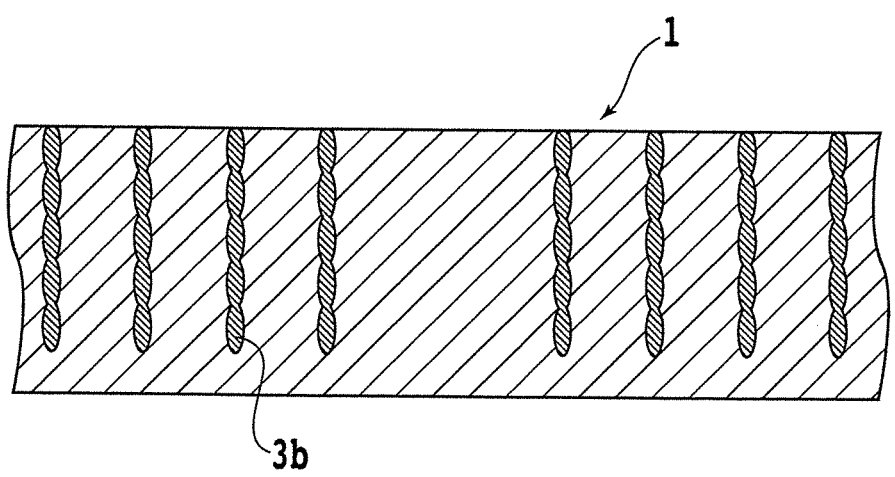
FIG. 3B is a sectional view schematically depicting another example of the modified region formed in the substrate.

In the modified region forming step, a laser processing apparatus 2 configured similarly to the laser processing apparatus 2 described in the above embodiment is used. In the present embodiment, the focal region of the laser beam 8 focused by the processing head 6 is substantially in a dot shape, and the laser beam 8 is applied multiple times to the substrate 1 while varying the height of the focal region in the regions of the substrate 1 in which to form the recesses or through-holes, to form the modified regions by multiphoton absorption. FIG. 3B is a sectional view schematically depicting the modified regions 3b formed in the substrate 1. When the laser beam 8 is applied multiple times to the substrate 1 while varying the height of the focal region, the modified regions 3b in each of which a plurality of modified regions in succession in the thickness direction of the substrate 1 are united together can be formed, as illustrated in FIG. 3B. Note that in this case, the laser beam 8 is focused sequentially on the plurality of focal points of the laser beam 8, in the order from the point closest to the lower surface of the substrate 1. When focusing the laser beam 8 inside the substrate 1, if a modified region is previously formed between the laser beam applied surface and the focal point, it is difficult to focus the laser beam 8 suitably.

In addition, in the modified region forming step according to the present embodiment, further, it is preferable to apply an external force or the like to the substrate 1, to thereby form cracks extending in the thickness direction of the substrate 1 from the modified regions 3b. When the cracks are formed in the substrate 1, the etchant can reach deep portions of the modified regions 3b in the manner of flowing along the cracks, in the etching step. Thereafter, also in the present embodiment, the etching step is conducted similarly to the above-described embodiment, whereby the recesses or through-holes can be formed in the substrate 1. Further, the electrode forming step is performed similarly to the above-described embodiment, whereby the electrodes along the thickness direction of the substrate 1 can be formed in the substrate 1. Thereafter, the upper surface and the lower surface of the substrate 1 are subjected to grinding or the like, whereby the through electrodes can be formed in the substrate 1.

Note that the present invention is not limited to the descriptions of the embodiments above, but can be carried out with various modifications. For instance, while the modified regions 3 formed in the substrate 1 is etched away to form the recesses or through-holes and the recesses or through-holes are filled with conductive members to form electrodes in the above embodiments, a mode of the present invention is not limited to this mode. The recesses or through-holes may be formed by other methods; for example, a laser beam of such a wavelength as to be absorbed in the substrate 1 may be applied to the substrate 1 to form recesses or through-holes by ablation, and the recesses or through-holes may be filled with conductive members to form electrodes.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A recess or through-hole forming method for forming a substrate with a recess or a through-hole along a thickness direction of the substrate, the recess or through-hole forming method comprising:
a modified region forming step of applying a laser beam of such a wavelength as to be transmitted through the substrate, to the substrate, with a focal region of the laser beam positioned inside the substrate, to form a hole exposed at least at one surface of the substrate and extending in the thickness direction of the substrate, and a modified region surrounding said hole; and
an etching step of etching the modified region to form the recess or the through-hole in the substrate, after the modified region forming step is performed.

2. The recess or through-hole forming method according to claim 1, wherein the substrate is a glass substrate.

3. The recess or through-hole forming method according to claim 1, wherein the modified region has a column-shape.

4. An electrode forming method for forming a substrate with a recess or a through-hole along a thickness direction of the substrate and forming an electrode in the recess or the through-hole, the electrode forming method comprising:
a modified region forming step of applying a laser beam of such a wavelength as to be transmitted through the substrate to the substrate, with a focal region of the laser beam positioned inside the substrate, to form a hole exposed at least at one surface of the substrate and extending in the thickness direction of the substrate, and a modified region surrounding said hole;
an etching step of etching the modified region to form the substrate with the recess or the through-hole, after the modified region forming step is performed; and
an electrode forming step of filling the recess or the through-hole with a conductive member to form the substrate with the electrode along the thickness direction of the substrate, after the etching step is performed.

5. The electrode forming method according to claim 4, wherein in the electrode forming step, the recess or the through-hole is filled with a conductive powder as the conductive member, and the substrate is heated to form the electrode.

6. The electrode forming method according to claim 4, wherein the modified region has a column-shape.

* * * * *